(12) United States Patent
Parry-Jones et al.

(10) Patent No.: US 9,284,852 B2
(45) Date of Patent: Mar. 15, 2016

(54) FLEXIBLE PRINTED CIRCUIT BOARD HARNESS

(71) Applicant: ROLLS-ROYCE PLC, London (GB)

(72) Inventors: Ian Mark Parry-Jones, Market Drayton (GB); Jaspal Singh Johal, Derby (GB); Alec Richard Groom, Bristol (GB)

(73) Assignee: ROLLS-ROYCE plc, London (GB)

( * ) Notice: Subject to any disclaimer, the term of this patent is extended or adjusted under 35 U.S.C. 154(b) by 657 days.

(21) Appl. No.: 13/659,502

(22) Filed: Oct. 24, 2012

(65) Prior Publication Data
US 2013/0111922 A1    May 9, 2013

(30) Foreign Application Priority Data

Nov. 4, 2011    (GB) .................................. 1119038.6

(51) Int. Cl.
| | |
|---|---|
| F01D 25/00 | (2006.01) |
| B60R 16/02 | (2006.01) |
| H01B 7/04 | (2006.01) |
| H02G 3/06 | (2006.01) |
| H02G 3/32 | (2006.01) |
| H02G 7/05 | (2006.01) |
| H05K 1/03 | (2006.01) |

(52) U.S. Cl.
CPC ............ *F01D 25/00* (2013.01); *B60R 16/0207* (2013.01); *B60R 16/0215* (2013.01); *H01B 7/041* (2013.01); *H01B 7/043* (2013.01); *H01B 7/045* (2013.01); *H01B 7/046* (2013.01); *H02G 3/065* (2013.01); *H02G 3/32* (2013.01); *H02G 7/053* (2013.01); *H05K 1/0393* (2013.01); *F05D 2240/00* (2013.01); *F05D 2250/30* (2013.01); *F05D 2260/30* (2013.01); *Y02T 50/672* (2013.01); *Y10T 29/49002* (2015.01)

(58) Field of Classification Search
CPC ............ B60R 16/0207; B60R 16/0215; H01B 7/041–7/046; H02G 3/065; H02G 3/32; H02G 7/053; H05K 1/0393; F05D 2260/30
See application file for complete search history.

(56) References Cited

U.S. PATENT DOCUMENTS

| | | | | | |
|---|---|---|---|---|---|
| 5,264,814 | A | * | 11/1993 | Yamazaki et al. | ............... 336/65 |
| 5,367,750 | A | | 11/1994 | Ward | |
| 8,038,104 | B1 | * | 10/2011 | Larkin | ............................ 248/55 |
| 2006/0243868 | A1 | * | 11/2006 | Nakamura | ..................... 248/113 |

FOREIGN PATENT DOCUMENTS

| | | | | | |
|---|---|---|---|---|---|
| GB | 2463867 | * | 3/2010 | ............. | H01R 12/14 |
| JP | A-2002-204082 | | 7/2002 | | |

OTHER PUBLICATIONS

Mar. 22, 2012 Search Report issued in British Patent Application No. GB1119038.6.

* cited by examiner

*Primary Examiner* — Phutthiwat Wongwian
*Assistant Examiner* — William Breazeal
(74) *Attorney, Agent, or Firm* — Oliff PLC

(57) ABSTRACT

A gas turbine engine installation is provided that has a flexible printed circuit board (FPCB) harness to transfer electrical signals, including electrical power, around a gas turbine engine. The FPCB harness is held to the gas turbine engine installation using clips. The clips have a jaw that has two sets of opposing teeth extending from a base, and a mouth through which the FPCB harness is inserted. The teeth point in a direction that has a component from the mouth to the teeth. This means that the force required to insert the FPCB harness into the clip is lower than the force required to pull the FPCB harness out of the clip in the opposite direction. This means that the FPCB harness can be secured in place while aiding ease of assembly.

13 Claims, 5 Drawing Sheets

PRIOR ART

FLEXIBLE PRINTED CIRCUIT BOARD HARNESS

CROSS-REFERENCE TO RELATED APPLICATIONS

This application is based upon and claims the benefit of priority from British Patent Application Number 1119038.6 filed 4 Nov. 2011, the entire contents of which are incorporated by reference.

BACKGROUND OF THE INVENTION

1. Field of the Invention

This invention relates to a network for distributing signals and power around a gas turbine engine using a flexible harness. In particular, this invention relates to clips for holding a flexible harness for a gas turbine engine.

2. Description of the Related Art

A typical gas turbine engine has a substantial number of electrical components which serve, for example, to sense operating parameters of the engine and/or to control actuators which operate devices in the engine. Such devices may, for is example, control fuel flow, variable vanes and air bleed valves. The actuators may themselves be electrically powered, although some may be pneumatically or hydraulically powered, but controlled by electrical signals.

Electrical power, and signals to and from the individual electrical components, are commonly transmitted along conductors. Conventionally, such conductors may be in the form of wires and cables which are assembled together in a harness. In such a conventional harness, each wire may be surrounded by an insulating sleeve, which may be braided or have a braided cover. The connections between the individual components and the conventional harness are made, for example, by multi-pin plug and socket connectors. Similarly, communication between the harness and power, control and signalling circuitry is achieved through a multi-pin connector.

By way of example, FIG. 1 of the accompanying drawings shows a typical gas turbine engine including two conventional wiring harnesses 102, 104, each provided with a respective connector component 106, 108 for connection to circuitry accommodated within the airframe of an aircraft in which the engine is installed.

The harnesses 102, 104 are assembled from individual wires and cables which are held together over at least part of their lengths by suitable sleeving and/or braiding. Individual wires and cables, for example those indicated at 110, emerge from the sleeving or braiding to terminate at plug or socket connector components 112 for cooperation with complementary socket or plug connector components 114 on, or connected to, the respective electrical components.

Each conventional harness 102, 104 therefore comprises a multitude of insulated wires and cables. This makes the conventional harness bulky, heavy and difficult to manipulate. It is desirable to reduce the size and weight of components on gas turbine engines, particularly, for example, gas turbine engines for use on vehicles, such as aircraft.

It is proposed to replace at least a portion of, for example all of, the conventional harness with a flexible printed circuit board harness (FPCB harness). An example of a portion of such a flexible printed circuit board harness 20 is shown in FIGS. 2 to 5. FIG. 2 shows a perspective view of the FPCB harness portion, and FIGS. 3, 4, and 5 show side, top, and cross-sectional views respectively.

Such an FPCB harness 20 may comprise a flexible (for example elastically deformable) substrate 40 with conductive tracks 30 laid/formed therein. The FPCB harness 20 may thus be deformable. In the example shown in FIGS. 2 to 5, the FPCB harness 20 extends along a length in the x-direction, a width in the y-direction, and a thickness (or depth or height) in the z-direction. The x direction may be defined as the axial direction of the FPCB harness. Thus, the x-direction (and thus the z-direction) may change along the length of the FPCB harness 20 as the FPCB harness is deformed. This is illustrated in FIG. 3. The x-y surface(s) may be said to be the major surface(s) of the FPCB harness. In the example shown in FIGS. 2 to 5, the FPCB harness is deformable in the z direction, i.e. in a direction perpendicular to the major surface. FPCB harnesses may be additionally of alternatively deformable about any other direction, and/or may be twisted about any one or more of the x, y, or z directions.

The flexible substrate 40 may be a dielectric. By way of example, the substrate material may be, by way of example only, polyamide. As will be readily apparent, other suitable substrate material could alternatively be used.

The conductive tracks 30, which may be surrounded by the substrate, may be formed using any suitable conductive material, such as, by way of example only, copper, although other materials could alternatively be used. The conductive tracks 30 may be used to conduct/transfer electrical signals and/or electrical power, for example around a gas turbine engine and/or to/from components of a gas turbine engine and/or an airframe attached to a gas turbine engine. The size (for example the cross-sectional area) and/or the shape of the conductive tracks 30 may depend on the signal to be transmitted through the particular conductive track 30. Thus, the shape and/or size of the individual conductive tracks 30 may or may not be uniform in a FPCB harness 20.

The example shown in FIGS. 2 to 5 has 6 conductive tracks 30 running through the substrate 40. However, the number of conductive tracks 30 running through a substrate 40 could be fewer than 6, or greater than 6. Indeed the number of conductive tracks 30 could be far greater than 6, for example tens or hundreds of tracks, as required. As such, many electrical signals and/or power transmission lines may be incorporated into a single FPCB harness.

A single FPCB harness 20 may comprise one layer of tracks, or more than one layer of tracks, for example, 2, 3, 4, 5, 6, 7, 8, 9, 10 or more than 10 layers of tracks. An FPCB harness may comprise significantly more than 10 layers of tracks, for example at least an order of magnitude more layers of tracks. In this regard, a layer of tracks may be defined as being a series of tracks that extend in the same x-y surface. Thus, the example shown in FIGS. 2 to 5 comprises 2 layers of tracks 30, with each layer comprising 3 tracks.

Using an FPCB harness to transmit electrical signals and/or power is therefore advantageous over a conventional harness, for example because of its reduced size, weight and/or complexity.

In order to attach a harness to a component (for example to a gas turbine engine or related airframe), a clip is required. An example of a clip that may be used to attach a conventional harness to a gas turbine engine is shown in FIG. 7. The clip 50 shown in FIG. 7 is configured to hold a cable, or a bundle of cables which form at least a part of a conventional wire cable harness. The clip 50 has a generally cylindrical outer casing 52 with a diameter 58 and a structural internal element 54 configured to provide strength to the clip 50. The clip 50 shown in FIG. 7 also has teeth 56 configured to grasp the generally cylindrical conventional cable harness, although the teeth 56 may not be present in some conventional clips.

FIGS. 8 and 9 show an alternative clip 60 for holding a conventional cable harness. The clip 60 shown in FIGS. 8 and 9 comprises two arms 64, 66 that define a space 62 therebetween for holding a conventional cable harness or bundle of cable harnesses. The space 62 defined between the two arms 64, 66 may be generally cylindrical. The two arms 64, 66 are sprung so as to be able to accommodate various diameters of conventional cable harnesses.

OBJECTS AND SUMMARY OF THE INVENTION

FPCB harnesses have properties that present difficulties when considering how to attach them to components, for example of a gas turbine engine. For example, the FPCB harnesses may have mechanical properties that mean that known clips, such as those described above, are not suitable for attaching them to components. Purely by way of example only, the flexible substrate material may be relatively easily damaged (for example punctured or sliced) by conventional clips.

As explained herein, FPCB harnesses offer considerable advantages over conventional harness in terms of, amongst other things, size and weight. It is desirable to maximize this size/weight benefit by providing an attachment device for allowing the FPCB harnesses to be connected to components in a compact, efficient manner. Conventional clips are therefore not desirable, or even suitable.

According to an aspect of the invention, there is provided a gas turbine engine installation comprising: a flexible printed circuit board harness arranged to transfer electrical signals around the engine installation; and at least one clip holding the printed circuit board harness. Each clip comprises a jaw extending from a base. The jaw comprises: a mouth having a width w for receiving the flexible printed circuit board harness; an upper set of teeth; and a lower set of teeth. Each tooth is compliant and has a root and a tip, and extends across at least a part of the width of the mouth. The teeth of at least one of the upper set and the lower set extend from root to tip in a direction that has a component pointing from the mouth to the base.

The electrical signals can be of any type that may be transmitted along electrical conductors, for example electrical power transmission, and/or signals (for example control signals) to, from or between components (for example electrical components) of the gas turbine engine installation. The FPCB harnesses for transmitting the electrical signals may be as described herein, for example with reference to FIGS. 2 to 5.

The teeth may be substantially wedge shaped, extending from a base to a relatively narrow tip. The wedge shape may have a substantially pointed cross section (which may, for example, be substantially triangular, optionally with straight or curved sides) which extends (or is extruded) along the width of the mouth. The teeth of the upper and/or lower set may be said to point (or have a component that points) in the direction of FPCB harness insertion into the jaw through its mouth.

Arranging the clip in the manner set out above, may enable the FPCB harness to be inserted into the mouth of the clip more easily than it can be pulled out of the clip. This allows, for example, the FPCB harness to be secured in place whilst facilitating assembly.

According to the invention, there is provided a method of assembling a gas turbine engine installation comprising: providing a flexible printed circuit board harness arranged to transfer electrical signals around the engine installation; and attaching the flexible printed circuit board harness to the rest of the gas turbine engine installation by inserting a portion thereof into a mouth of a jaw of a clip, the jaw extending from a base of the clip, and the mouth extending across a width w. The jaw comprises an upper set of teeth and a lower set of teeth. Each tooth is compliant and has a root and a tip, and extends across at least a part of the width of the mouth. The teeth of at least one of the upper set and the lower set extend from root to tip in a direction that has a component pointing from the mouth to the base of the jaw such that the force required to insert the flexible printed circuit board harness into the mouth of the jaw is lower than the force required to remove the flexible printed circuit board harness from the mouth of the jaw.

This method provides various advantages, including those outlined above and elsewhere herein in relation to the gas turbine engine installation.

The teeth of the upper set and the lower set may be offset such that the tips of the upper set are not directly opposed to tips of the lower set. This may further assist in reducing the force required to insert the FPCB harness by ensuring that only one tooth at a time need to be deformed in order to insert the FPCB harness into the jaw. This arrangement may also assist in spreading the load exerted by the teeth across the FPCB harness once it has been inserted.

The tips of the upper set of teeth may overlap with the tips of the lower set of teeth, such that the upper and lower set of teeth may be intermeshed, at least prior to the FPCB harness being inserted. This may be a particularly suitable arrangement for holding FPCB harnesses that are particularly thin because the compliant teeth would provide sufficient gripping force once displaced/deformed by the FPCB harness. However, in other arrangements the tips of the upper and lower set of teeth may not overlap, and thus the teeth may not intermesh, even when in an undeformed state, such as prior to insertion of the FPCB harness.

The teeth of both the upper set and the lower set may extend from root to tip in a direction that has a component pointing from the mouth to the base. This may increase the difference between the force required to insert the FPCB harness into the clip and the force required to remove the FPCB harness from the clip.

The teeth may extend across substantially the full width of the mouth of the jaw. The mouth may extend across substantially the full width of the jaw. This may provide maximum gripping area per tooth for a given size of clip.

The jaw may be formed using a material comprising one or more of: ethylene-propylene rubber, a silicone based compound, and a nitrite material. These materials may provide good grip to a FPCB harness whilst being compliant so as to minimize the possibility of damage to the FPCB harness. The particular material may be chosen depending on the application, for example the environment (for example in terms of temperature variation) in which the clip is to be used and/or the type of FPCB harness it is to be used with.

The clip may comprise a support structure configured to resist changes in shape of the clip under operational loads. The support structure may be relatively more stiff than the jaw. As such, the support structure may help to reduce, or substantially prevent, flexing of the clip, for example flexing of the external shape of the clip. This may help to ensure that the jaws retain the desired shape under load, for example it may help to ensure that the jaws don't flex apart more than a desired amount when a FPCB harness is inserted. This may help to ensure that the FPCB harness is clamped with the desired force.

The clip may comprise a main body that may incorporate the jaw and the base. The main body may thus be integral with the jaw and the base, for example, manufactured from the same material and/or in the same process as the jaw and the base. The support structure may extend around at least a part of the main body. This may be a convenient arrangement for providing structural support to the clip.

The support structure may be formed using a material comprising metal and/or a composite/fibre resin. The support structure may thus be constructed using a material that is more stiff than the main body and/or the jaw of the clip. This may allow the clip to be structurally stiff, whilst retaining compliant teeth for gripping the FPCB harness.

The support structure may further comprise an attachment portion used to attach the clip to the gas turbine engine, or a component thereof. Thus, the clip can be particularly compact, with a minimal number of parts required to attach it (and thus a FPCB harness) to a component. This may have further weight and/or size benefits.

Each flexible printed circuit board harness may be described as a thin, elongate member. Such a thin, elongate member may have a major surface defined by a length and a width, and a thickness normal to the major surface. The teeth of the clip may thus contact, and grip, the major surface (the elongate member may be said to have two parallel major surfaces offset by the thickness of the FPCB, with one set of teeth contacting and gripping one major surface and the other set of teeth contacting and gripping the other major surface).

The width of the mouth, across which the teeth extend, may be arranged to be substantially aligned with the length direction of flexible printed circuit board harness. This may allow effective gripping of the inserted FPCB harness to ensure that it does not move, or fall out, through the mouth of the jaw.

A lengthwise extending portion of the flexible printed circuit board harness may be held by two opposing clips, each opposing clip extending across no more than half of the width of the flexible printed circuit board harness. Such an arrangement may provide more secure retention of the FPCB harness. For example, such an arrangement may reduce (or substantially eliminate) the possibility of the FPCB harness being pulled out of a clip in a width direction of the FPCB harness.

BRIEF DESCRIPTION OF THE DRAWINGS

The invention will now be described, by way of example only, with reference to the accompanying Figures, in which.

DETAILED DESCRIPTION OF THE PREFERRED EMBODIMENTS

Figure 1:
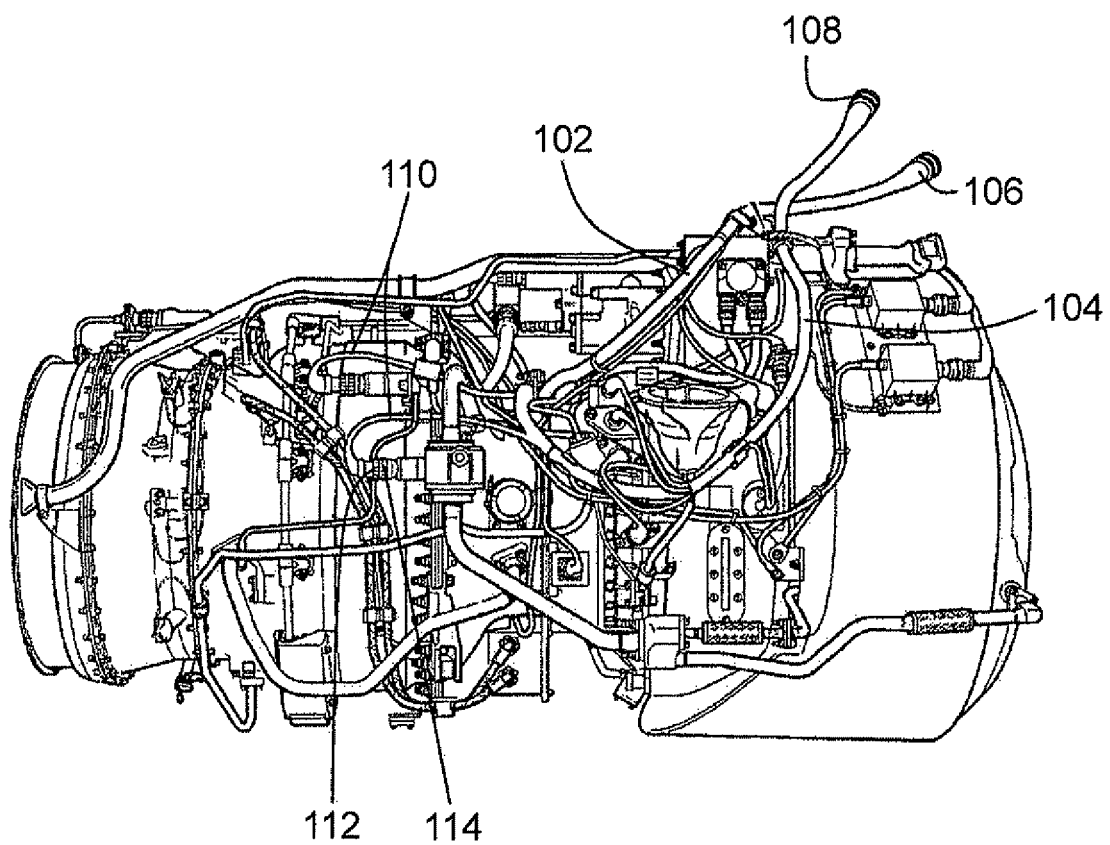
FIG. 1 shows a gas turbine engine with a conventional harness.
Figure 2:
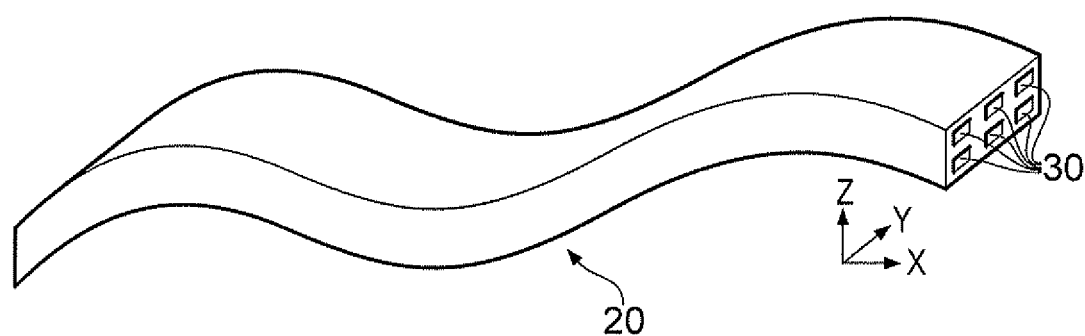
FIG. 2 shows perspective view of a portion of a flexible printed circuit board harness.
Figure 3:
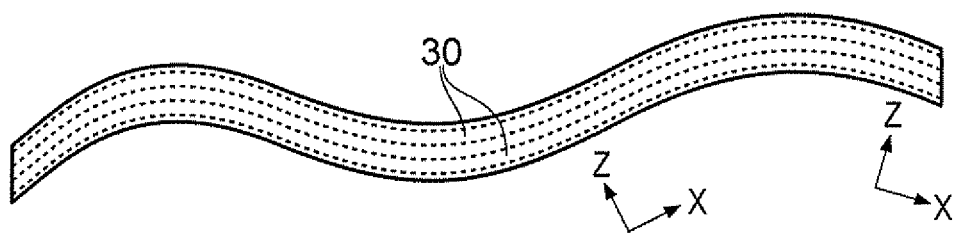
FIG. 3 shows a side view of the flexible printed circuit board harness of FIG. 2.
Figure 4:
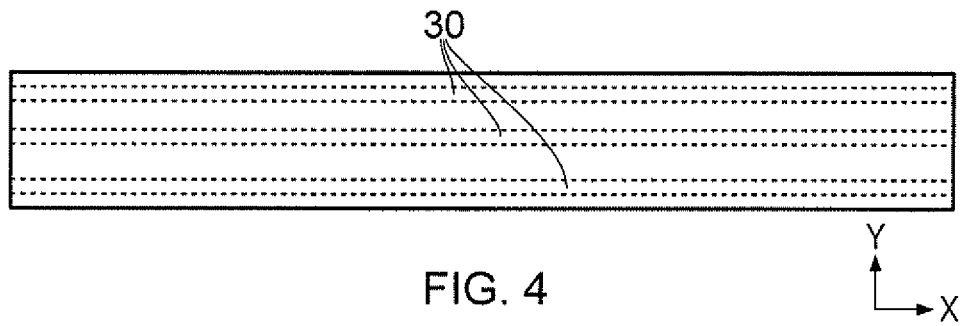
FIG. 4 shows a top view of the flexible printed circuit board harness of FIG. 2.
Figure 5:
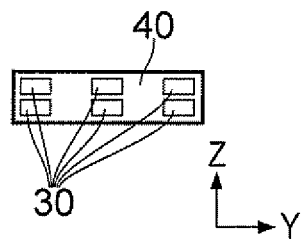
FIG. 5 shows a cross-sectional view of the flexible printed circuit board harness of FIG. 2.
Figure 6:
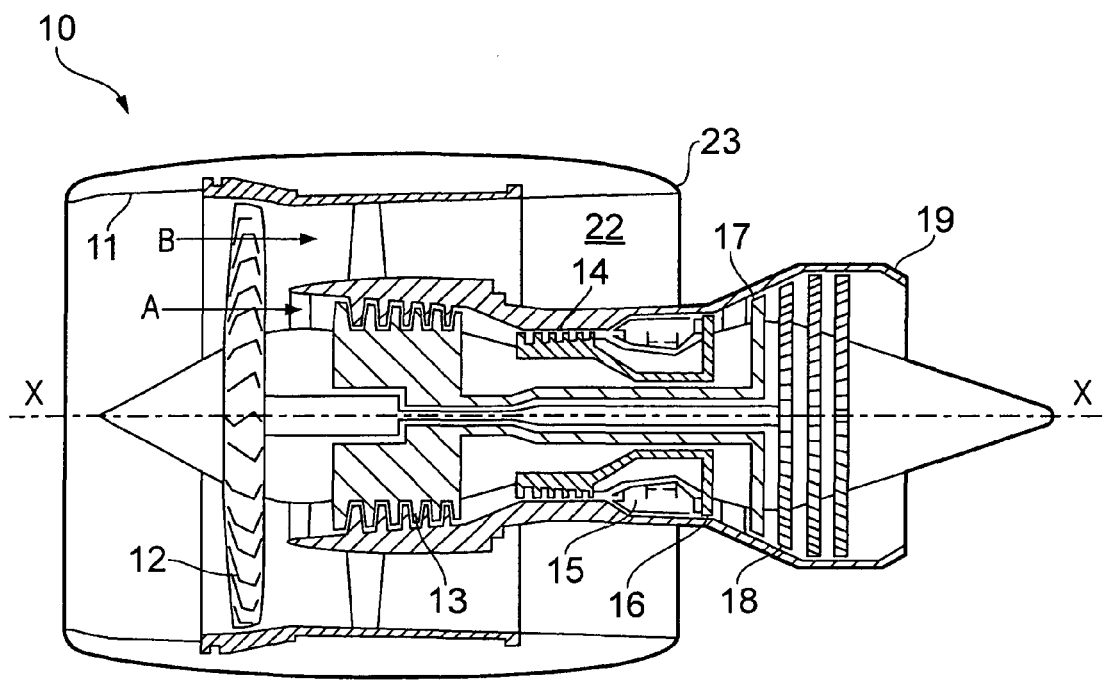
FIG. 6 is a cross-section through a gas turbine engine.
Figure 7:
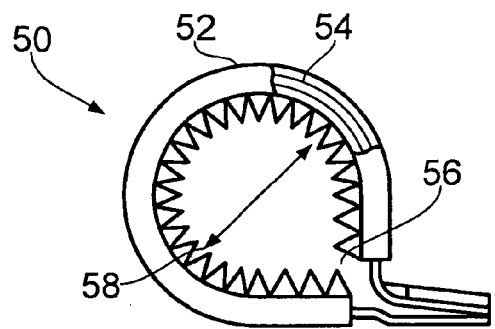
FIG. 7 shows a side view of a clip for holding a conventional harness in place.
Figure 8:
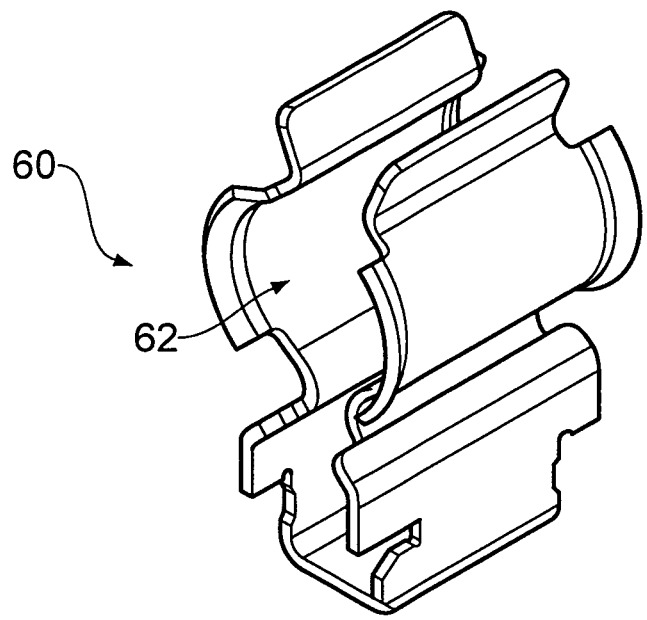
FIG. 8 shows a perspective view of an alternative clip for holding a conventional harness in place.
Figure 9:
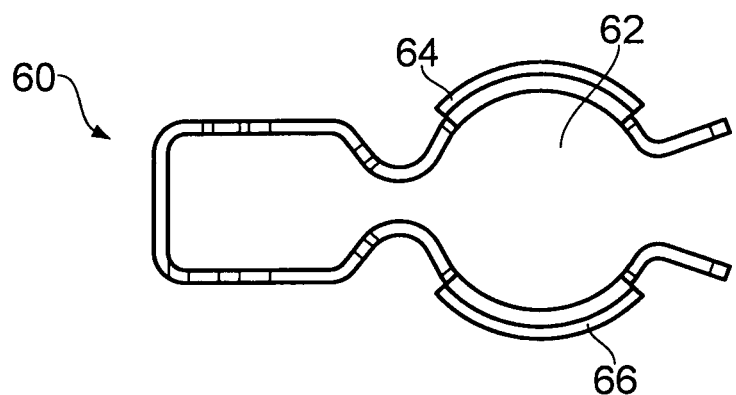
FIG. 9 shows a side view of the clip shown in FIG. 8.

With reference to FIG. 6, a ducted fan gas turbine engine generally indicated at 10 has a principal and rotational axis X-X. The engine 10 comprises, in axial flow series, an air intake 11, a propulsive fan 12, an intermediate pressure compressor 13, a high-pressure compressor 14, combustion equipment 15, a high-pressure turbine 16, and intermediate pressure turbine 17, a low-pressure turbine 18 and a core engine exhaust nozzle 19. The engine also has a bypass duct 22 and a bypass exhaust nozzle 23.

The gas turbine engine 10 works in a conventional manner so that air entering the intake 11 is accelerated by the fan 12 to produce two air flows: a first air flow A into the intermediate pressure compressor 13 and a second air flow B which passes through the bypass duct 22 to provide propulsive thrust. The intermediate pressure compressor 13 compresses the air flow A directed into it before delivering that air to the high pressure compressor 14 where further compression takes place.

The compressed air exhausted from the high-pressure compressor 14 is directed into the combustion equipment 15 where it is mixed with fuel and the mixture combusted. The resultant hot combustion products then expand through, and thereby drive the high, intermediate and low-pressure turbines 16, 17, 18 before being exhausted through the nozzle 19 to provide additional propulsive thrust. The high, intermediate and low-pressure turbines 16, 17, 18 respectively drive the high and intermediate pressure compressors 14, 13 and the fan 12 by suitable interconnecting shafts.

The gas turbine engine 10 shown in FIG. 6 may be at least a part of a gas turbine engine installation according to the present invention. The gas turbine engine 10 may comprise FPCB harnesses (such as those described above in relation to FIGS. 2 to 5) for transmitting/transferring electrical signals around the engine and/or to/from the engine 10 from other components, such as components of an airframe. The function and/or construction of the FPCB harnesses may be as described above and elsewhere herein.

Figure 10:
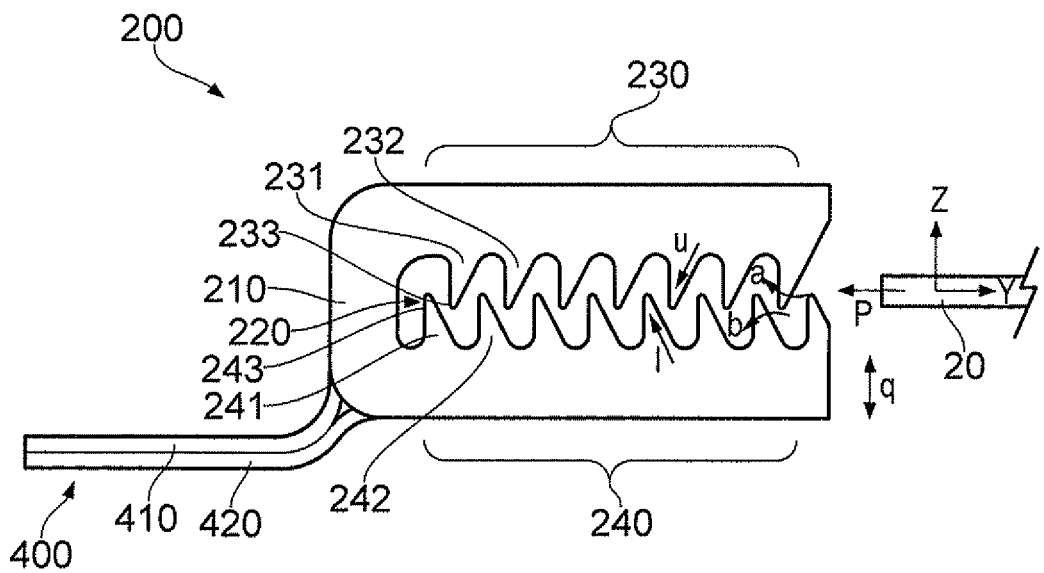
FIG. 10 shows a side view of clip in accordance with the present invention.
Figure 11:
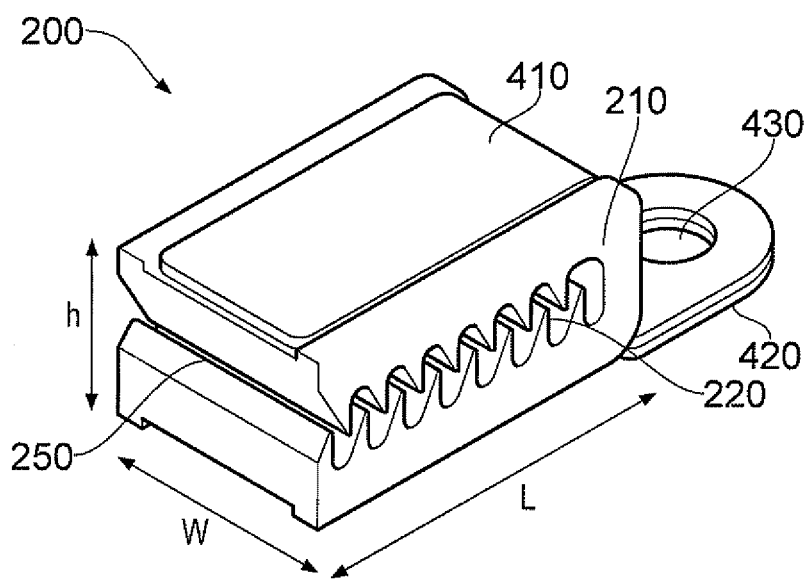
FIG. 11 shows a perspective view of the clip according to FIG. 10.

The FPCB harnesses may be attached to any part of the engine installation (of which the engine 10 may be a part) using a clip such as the clip 200 shown in FIGS. 10 and 11. In each of FIGS. 10 and 11, just one clip 200 is shown. The FPCB harness could be held at a lengthwise position by just one clip 200. Alternatively, two clips 200 may be used in conjunction with each other to hold opposing sides of a FPCB harness 20 at a given lengthwise position.

The clip 200 has a base, or base portion, 210. A jaw 220 extends from the base 210. Together, the jaw 220 and the base 210 may be said to form a main body of the clip 200. The jaw 220 comprises an upper set of teeth 230 and a lower set of teeth 240. The upper set of teeth 230 and the lower set of teeth 240 form a jaw opening, or mouth, 250. The mouth 250 is configured to receive a FPCB harness 20. As shown in FIG. 10, the FPCB harness may be inserted into the mouth 250 in a direction 'p'. The direction 'p' may be substantially aligned with the width direction 'y' of the FPCB harness 20.

In the clip shown in FIGS. 10 and 11, the teeth are angled towards the base 210. Thus, the direction 'u' in which the upper teeth point and the direction 'l' in which the lower teeth point (which may be referred to as the direction in which the upper and lower teeth extend from root 231, 241 to tip 233, 243) both have a component in the direction from the mouth 250 to the base 210. As shown in FIG. 10, the direction from the mouth 250 to the base 210 may correspond to the direction 'p' of insertion of the FPCB harness 220 into the clip 200.

In some embodiments, not all of the teeth, i.e. just some of the teeth 232, 242, may extend (or point) in a direction that has a component in the direction from the mouth 250 to the base 210. For example, in some embodiments, only the teeth 232 of the upper set of teeth 230 may extend (or point) in a direction that has a component in the direction from the mouth 250 to the base 210. In other embodiments only the teeth 242 of the lower set of teeth 240 may extend (or point) in a direction that has a component in the direction from the mouth 250 to the base 210. A gas turbine engine comprising one or more FPCB harnesses 20 may comprise any combination of the various clips in accordance with the invention, optionally in addition to other clips that may not be in accordance with the invention.

When the FPCB harness 20 is inserted into the jaw 220 of the clip 200, the upper teeth 232 deflect upwards (towards their root 231) and in the direction of insertion and the lower teeth 242 deflect downwards (towards their root 241) and in the direction of insertion. In FIG. 10, the arrow 'a' represents this deflection for the upper set of teeth, and the arrow 'b' represents this deflection for the lower set of teeth. It is easier to move the FPCB in the insertion direction 'p' than in the removal direction (which is the opposite direction to the insertion direction 'p'). This may be because deflection of the teeth that extend in a direction that has a component in the direction from the mouth 250 to the base 210 when pushed in the insertion direction 'p' causes them to move away from the major surface of the FPCB 20, towards their root (as illustrated by arrows 'a' and 'b') whereas deflection of those teeth when pushed in the removal direction causes them to move towards the major surface of the FPCB 20, away from their root, thus causing those teeth to grip the FPCB harness 20 more tightly. Additionally or alternatively, the force required to deflect the teeth that extend in a direction that has a component in the direction from the mouth 250 to the base 210 may be lower in the insertion direction than in the removal direction.

Thus, once inserted, the FPCB harness 20 is held by the clip 200, for example through being gripped by the opposing sets of teeth 230, 240, which may be compliant and/or flexible and/or elastically deformable. In order to remove the FPCB harness 20 through the mouth 250 of the clip 200, a greater force is required than that which was required to insert it.

The teeth 232, 242 of FIGS. 10 and 11 are shown as having substantially triangular cross-sections extending in the direction of the width 'w' of the mouth 250 of the clip 200 to form substantially wedge shaped teeth (note that this width 'w' of the mouth 250 may extend in substantially the same direction as the local length direction 'x' of the FPCB harness 20 being held by the clip 200). In other embodiments, the cross sections could be other shapes, for example two curved surfaces extending from a root to a tip. The teeth 232, 242 may or may not extend across the full width 'w' of the mouth 250. For example, there could be one or more gap(s) in the teeth in the width direction, such that two (or more) teeth extend next to each other in the width direction 'w'.

The teeth 232 of the upper set 230 and the teeth 242 of the lower set 240 are offset in the insertion direction 'p', such that their tips 233, 243 are not directly opposed. In other embodiments, the upper teeth 232 and the lower teeth 242 may be directly opposed, although this would require them not to overlap (in the direction labelled 'q' in FIG. 10). In the clip 200 shown in FIGS. 10 and 11, the upper teeth 232 and the lower teeth 242 do overlap, and thus intermesh in the undeformed state (i.e. when the FPCB harness is not inserted into the clip 200). The extent of overlap of the tips 233, 243 of the teeth 232, 242, or the gap between the tips 233, 243 in the overlap direction 'q', may depend on the thickness (in the 'z' direction) of the FPCB harness 20. Thus, thicker FPCB harnesses 20 may require less overlap, no overlap, or separation between the tips 233, 243 of the upper and lower teeth, The clip 200 shown in FIGS. 10 and 11 has a support structure 400. The support structure 400 provides support to the main body 201 of the clip so as to restrict or minimize flexing/bending of the clip 200. The support structure 400 may thus be stiffer, for example constructed from a stiffer material, than the main body of the clip. The support structure 400 shown in the Figures is attached (for example bonded) to external surfaces of the main body. However, other arrangements of support structure 400 may be used. For example, the support structure may penetrate into the material of the main body of the clip 200. The support structure 400 shown in the Figures comprises two parts 410, 420, that may be attached together (for example by welding) to produce the final support structure 400. Again, other constructions could be used in clips for alternative embodiments.

The support structure 400 shown in the figures has an attachment portion 430 (which in the illustrated example comprises a hole for receiving a fixing element, such as a screw, bolt, or rivet) that is configured to allow the clip 200 to be attached to a component, for example of the gas turbine installation. As mentioned above, this may be a particularly convenient, lightweight and compact arrangement for connecting the clip 200, and thus the FPCB harnesses 20, to components. However, some clips for use in embodiments of the invention may not have a support structure 400 at all, or may have a support structure 400 without an attachment portion 430.

Any suitable material may be used to manufacture the main body of the clip 200. For example, the material may comprise one or more of ethylene-propylene rubber, a silicone based compound, and a nitrile material. In clips which have a support structure 400, the support structure 400 may be constructed from a stiffer material than the main body, for example from a metal and/or a resin/fibre composite.

The dip 200 could be any suitable size required to hold a FPCB harness 20. Purely by way of non-limitative example, and with reference to FIG. 10, the width 'w' of the clip 200, 300 may be in the range of from 5 mm to 200 mm, for example 10 mm to 150 mm, for example 25 mm to 100 mm, for example on the order of 50 mm. The length 'l' of the clip 200, 300 may be in the range of from 5 mm to 500 mm, for example 10 mm to 200 mm, for example 25 mm to 100 mm, for example on the order of 50 mm. The height 'h' of the clip 200, 300 may be in the range of from 0.5 mm to 50 mm for example 2 mm to 10 mm, for example 3 mm to 8 mm, for example on the order of 5 mm. In other embodiments, the dimensions 'l', 'h', and 'w' may be outside these ranges.

Whilst the clip 200 has been described with reference to FIGS. 10 and 11 that have just one jaw 220, other embodiments may comprise more than one jaw, and thus may be able to accept and hold more than one FPCB harness 20.

Where reference is made herein to a gas turbine engine installation, it will be appreciated that this term may include a gas turbine engine and/or any peripheral components to which the gas turbine engine may be connected to or interact with and/or any connections/interfaces with surrounding components, which may include, for example, an airframe and/or components thereof. Such connections with an airframe, which are encompassed by the term 'gas turbine engine installation' as used herein include, but are not limited to, pylons and mountings and their respective connections. The gas turbine engine itself may be any type of gas turbine engine, including, but not limited to, a turbofan (bypass) gas turbine engine, turbojet, turboprop, ramjet, scramjet or open rotor gas turbine engine, industrial It will be appreciated that many alternative configurations and/or arrangements of the clip 200 other than those described herein may fall within the scope of the invention. For example, alternative arrangements of jaw 220, teeth sets 230, 240, tooth geometry 232, 242 (such as tip geometry 233, 243), support structure 400, and/or FPCB harness 20 may fall within the scope of the invention and may be readily apparent to the skilled person from the disclosure provided herein. Furthermore, any feature described and/or claimed herein may be combined with any other compatible feature described in relation to the same or another embodiment.

We claim:

1. A gas turbine engine installation comprising:
    a flexible printed circuit board harness arranged to transfer electrical signals around the gas turbine engine installation; and
    at least one clip holding the flexible printed circuit board harness, each clip comprising a jaw extending from a base, the jaw comprising:
    a mouth having a width for receiving the flexible printed circuit board harness; an upper set of teeth comprising at least two teeth, each tooth in the upper set of teeth being separated from other tooth or teeth in the upper set of teeth in a direction pointing from the mouth to the base; and
    a lower set of teeth comprising at least two teeth, each tooth in the lower set of teeth being separated from other tooth or teeth in the lower set of teeth in a direction pointing from the mouth to the base, wherein:
    each tooth is elastically deformable and has a root and a tip, and extends across at least a part of the width of the mouth, the upper set of teeth and the lower set of teeth being configured to grip the flexible printed circuit board therebetween; and
    teeth of at least one of the upper set of teeth and the lower set of teeth extend from the root to the tip in a direction that has a component pointing from the mouth to the base.

2. The gas turbine engine installation according to claim 1, wherein the teeth of the upper set of teeth and the lower set of teeth are offset such that the tips of the upper set of teeth are not directly opposed to the tips of the lower set of teeth.

3. The gas turbine engine installation according to claim 2, wherein the tips of the upper set of teeth overlap with the tips of the lower set of teeth, such that the upper and lower set of teeth are intermeshed prior to elastic deformation of either the upper set of teeth or the lower set of teeth.

4. The gas turbine engine installation according to claim 1, wherein the teeth of both the upper set of teeth and the lower set of teeth extend from the root to the tip in a direction that has a component pointing from the mouth to the base.

5. The gas turbine engine installation according to claim 1, wherein the teeth extend substantially fully across the width of the mouth.

6. The gas turbine engine installation according to claim 1, wherein the jaw is formed using a material comprising one or more of: ethylene-propylene rubber, a silicone based compound, and a nitrile material.

7. The gas turbine engine installation according to claim 1, wherein the at least one clip further comprises a support structure configured to resist changes in the shape of the at least one clip under operational loads, the support structure being relatively stiffer than the jaw.

8. The gas turbine engine installation according to claim 7, wherein:
    the at least one clip comprises a main body that incorporates the jaw and the base; and
    the support structure extends around at least a part of the main body.

9. The gas turbine engine installation according to claim 7, wherein the support structure is formed using a material comprising metal and/or a composite/fibre resin.

10. The gas turbine engine installation according to claim 7, wherein the support structure further comprises an attachment portion used to attach the at least one clip to the gas turbine engine installation, or a component thereof.

11. The gas turbine engine installation according to claim 1, wherein:
    the flexible printed circuit board harness is a thin, elongate member having a major surface defined by a length of the major surface and a width of the major surface, and a thickness normal to the major surface; and
    the width of the mouth is arranged to be substantially aligned with the local length direction of the flexible printed circuit board harness.

12. The gas turbine engine installation according to claim 11, wherein:
    the at least one clip comprises two clips placed in opposition to each other, wherein a lengthwise extending portion of the flexible printed circuit board harness is held by the two clips, each clip extending across no more than half of the width of the major surface.

13. A method of assembling a gas turbine engine installation comprising:
    providing a flexible printed circuit board harness arranged to transfer electrical signals around the pas turbine engine installation;
    attaching the flexible printed circuit board harness to a remainder of the gas turbine engine installation by inserting a portion thereof into a mouth of a jaw of a clip, the jaw extending from a base of the clip, and the mouth extending across a width, wherein:
    the jaw comprises an upper set of teeth comprising at least two teeth, each tooth in the upper set of teeth being separated from other tooth or teeth in the upper set of teeth in a direction pointing from the mouth to the base and a lower set of teeth comprising at least two teeth, each tooth in the lower set of teeth being separated from other tooth or teeth in the lower set of teeth in a direction pointing from the mouth to the base,
    each tooth being elastically deformable and having a root and a tip, and extending across at least a part of the width of the mouth, the upper set of teeth and the lower set of teeth being configured to grip the flexible printed circuit board therebetween; and
    teeth of at least one of the upper set of teeth and the lower set of teeth extend from the root to the tip in a direction that has a component pointing from the mouth to the base such that a force required to insert the flexible printed circuit board harness into the mouth of the jaw is lower than a force required to remove the flexible printed circuit board harness from the mouth of the jaw.

* * * * *